(12) United States Patent
Liu et al.

(10) Patent No.: US 12,411,585 B2
(45) Date of Patent: Sep. 9, 2025

(54) TOUCH DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Yitong Liu, Wuhan (CN); Zhuo Zhang, Wuhan (CN); Zengjian Jin, Wuhan (CN); Xiang Zuo, Wuhan (CN)

( * ) Notice: Subject to any disclaimer, the term of this patent is extended or adjusted under 35 U.S.C. 154(b) by 0 days.

(21) Appl. No.: 17/795,242

(22) PCT Filed: Jun. 30, 2022

(86) PCT No.: PCT/CN2022/102843
§ 371 (c)(1),
(2) Date: Jul. 26, 2022

(87) PCT Pub. No.: WO2023/236287
PCT Pub. Date: Dec. 14, 2023

(65) Prior Publication Data
US 2024/0188400 A1   Jun. 6, 2024

(30) Foreign Application Priority Data
Jun. 6, 2022   (CN) .......................... 202210633037.2

(51) Int. Cl.
*G06F 3/044* (2006.01)
*G06F 3/041* (2006.01)
(Continued)

(52) U.S. Cl.
CPC .......... *G06F 3/0448* (2019.05); *G06F 3/0412* (2013.01); *G06F 3/0446* (2019.05);
(Continued)

(58) Field of Classification Search
CPC .............................. G06F 3/0448; G06F 3/044
See application file for complete search history.

(56) References Cited

U.S. PATENT DOCUMENTS

| | | | |
|---|---|---|---|
| 2021/0191556 A1* | 6/2021 | Lee | H10K 59/8731 |
| 2022/0229506 A1* | 7/2022 | Li | G06F 3/0448 |

(Continued)

FOREIGN PATENT DOCUMENTS

| | | | | |
|---|---|---|---|---|
| CN | 109375821 A | * | 2/2019 | G06F 3/041 |
| CN | 208488731 U | | 2/2019 | |

(Continued)

OTHER PUBLICATIONS

International Search Report in International application No. PCT/CN2022/102843, mailed on Dec. 20, 2022.

(Continued)

*Primary Examiner* — Ratisha Mehta
*Assistant Examiner* — Adam Joseph Mott

(57) ABSTRACT

A touch display panel is provided. The angle between an opening direction of a fracture and a grid line of a grid of a grid electrode in the present application is arranged to be acute an angle, so that the opening direction of the fracture is not perpendicular to the grid line of the grid of the grid electrode, and the opening of the fracture is narrowed, thereby reducing a light leakage of a plurality of sub-pixels located in the grid, which reduces a display panel color shift, and thus reducing a problem of uneven display caused by the display panel color shift.

20 Claims, 7 Drawing Sheets

(51) Int. Cl.
*H10K 59/40* (2023.01)
*H10K 59/80* (2023.01)

(52) U.S. Cl.
CPC ......... *H10K 59/40* (2023.02); *H10K 59/8791* (2023.02); *G06F 3/041* (2013.01); *G06F 3/044* (2013.01)

(56) References Cited

U.S. PATENT DOCUMENTS

| | | | |
|---|---|---|---|
| 2023/0022014 A1* | 1/2023 | Bang | H10K 59/131 |
| 2023/0259238 A1* | 8/2023 | Kim | G06V 40/1318 |
| | | | 345/173 |
| 2024/0248569 A1* | 7/2024 | Zhang | G06F 3/0446 |
| 2025/0117101 A1* | 4/2025 | Miyazaki | G06F 3/041 |

FOREIGN PATENT DOCUMENTS

| | | | | |
|---|---|---|---|---|
| CN | 110968220 A * | 4/2020 | ........... | G06F 3/0412 |
| CN | 111506218 A | 8/2020 | | |
| CN | 113424325 A * | 9/2021 | ........... | G06F 3/0412 |
| WO | WO-2020118910 A1 * | 6/2020 | ........... | G06F 3/0412 |
| WO | WO-2021227390 A1 * | 11/2021 | ........... | G06F 3/0412 |

OTHER PUBLICATIONS

Written Opinion of the International Search Authority in International application No. PCT/CN2022/102843, mailed on Dec. 20, 2022.

\* cited by examiner

TOUCH DISPLAY PANEL

FIELD OF DISCLOSURE

The present disclosure relates to the field of display technology, and more particularly, to a touch display panel.

BACKGROUND OF DISCLOSURE

A touch technology of a display panel has gradually developed from an add-on touch panel (TP) technology to a direct on thin film encapsulation touch (DOT) layer with a touch sensor on the liquid crystal panel. Compared with the add-on TP, DOT is directly integrated on the display panel, no separate flexible circuit board is required, a cost is lower, and further facilitates achieving flexible bending of the display panel.

A conventional DOT technology is a metal mesh structure adopting metal mesh lines, i.e., achieving capturing and identifying touch signals through a mutual capacitance sensing of the metal mesh lines after exposure and etching, and having sub-pixels located in the metal mesh to prevent light of the sub-pixels from emitting. In a current display panel of a mutual capacitance mode, driving electrodes and sensing electrodes are obtained by cutting a portion of the mesh lines in an entire metal mesh, and dummy electrodes are also provided. However, in the portion of the mesh lines that are cut, a fracture region formed through cutting and other regions of the metal grid in addition to the fracture region have different reflection effects on the light emitted by the sub-pixels and an external ambient light. Specifically, the fracture region does not reflect light, and the other regions of the metal mesh in addition to the fracture region easily reflect light. That is to say, the light emitted by the sub-pixels located in the metal mesh with the fracture is different from light emitted by the sub-pixels located in the metal mesh without the fracture, causing a color shift and uneven display is likely to occur on a display screen.

SUMMARY

The present application provides a touch display panel to solve a problem of uneven display caused by a display panel color shift.

The present application provides a touch display panel including:
- a display light-emitting layer, wherein the display light-emitting layer includes a plurality of sub-pixels arranged at intervals; and
- a grid electrode, wherein the grid electrode is arranged on a light-emitting side of the display light-emitting layer, and the plurality of sub-pixels are located in a grid of the grid electrode; wherein,
- a portion of the grid of the grid electrode is provided with a fracture, the fracture includes a first section and a second section, an angle between the first section and a grid line of the portion of the grid with the fracture of the grid electrode and an angle between the second section and the grid line of the portion of the grid with the fracture of the grid electrode is are each an acute angle.

Optionally, in some embodiments of the present application, an orthographic projection of the first section in a direction perpendicular to the grid line of the grid electrode and an orthographic projection of the second section in the direction perpendicular to the grid line of the grid electrode are overlapped on an overlapping portion, and an orthographic projection of a center point of each of the plurality of sub-pixels in the direction perpendicular to the grid line of the grid electrode is located within a range of the overlapping portion.

Optionally, in some embodiments of the present application, an extension plane of the first section and an extension plane of the second section in an opening direction of the fracture are neither intersected nor tangent to the plurality of sub-pixels on a plane.

Optionally, in some embodiments of the present application, a first channel and a second channel are formed between the first section and the second section, wherein an angle is between the first channel and the second channel.

Optionally, in some embodiments of the present application, a first concave portion is provided on the first section, and a first protrusion portion protruding toward the first concave portion is provided on the second section.

Optionally, in some embodiments of the present application, a width of a cross-sectional shape of the first concave portion in a thickness direction of the display light-emitting layer is arranged ascendingly in a direction from the first section to the second section, and a width of a cross-sectional shape of the first protrusion in the thickness direction of the display light-emitting layer is arranged ascendingly in the direction from the first section to the second section.

Optionally, in some embodiments of the present application, the cross-sectional shape of the first concave portion and the cross-sectional shape of the first protrusion portion in the thickness direction of the display light-emitting layer are square, and the width of the cross-sectional shape of the first concave portion in the thickness direction of the display light-emitting layer is greater than the width of the cross-sectional shape of the first protrusion portion in the thickness direction of the display light-emitting layer.

Optionally, in some embodiments of the present application, an end of the first protruding portion is located in the first concave portion.

Optionally, in some embodiments of the present application, a second protrusion portion protruding toward a direction of the second section is provided on the first section.

Optionally, in some embodiments of the present application, an orthographic projection of the first protrusion portion in a direction parallel to the first section or the second section and an orthographic projection of the second protrusion portion in the direction parallel to the first section or the second section at least partially overlap.

Correspondingly, the present application further provides a touch display panel including:
- a display light-emitting layer, wherein the display light-emitting layer includes a plurality of sub-pixels arranged at intervals; and
- a grid electrode, wherein the grid electrode is arranged on a light-emitting side of the display light-emitting layer, and the plurality of sub-pixels are located in a grid of the grid electrode; wherein,
- a portion of the grid of the grid electrode is provided with a fracture, the fracture includes a first section and a second section, and an angle between the first section and a grid line of the portion of the grid with the fracture of the grid electrode and an angle between the second section and the grid line of the portion of the grid with the fracture of the grid electrode are each an acute angle; and
- the angle between the first section and the grid line of the portion of the grid with the fracture of the grid electrode and the angle between the second section and the grid line of the portion of the grid with the fracture of the grid electrode is are both greater than or equal to 30 degrees and less than 90 degrees.

Optionally, in some embodiments of the present application, an orthographic projection of the first section in a direction perpendicular to the grid line of the grid electrode and an orthographic projection of the second section in the direction perpendicular to the grid line of the grid electrode are overlapped on an overlapping portion, and an orthographic projection of a center point of each of the plurality of sub-pixels in the direction perpendicular to the grid line of the grid electrode is located within a range of the overlapping portion.

Optionally, in some embodiments of the present application, an extension plane of the first section and an extension plane of the second section in an opening direction of the fracture are neither intersected nor tangent to the plurality of sub-pixels on a plane.

Optionally, in some embodiments of the present application, a first channel and a second channel are formed between the first section and the second section, wherein an angle is between the first channel and the second channel.

Optionally, in some embodiments of the present application, a first concave portion is provided on the first section, and a first protrusion portion protruding toward the first concave portion is provided on the second section.

Optionally, in some embodiments of the present application, a width of a cross-sectional shape of the first concave portion in a thickness direction of the display light-emitting layer is arranged ascendingly in a direction from the first section to the second section, and a width of a cross-sectional shape of the first protrusion in the thickness direction of the display light-emitting layer is arranged ascendingly in the direction from the first section to the second section.

Optionally, in some embodiments of the present application, the cross-sectional shape of the first concave portion and the cross-sectional shape of the first protrusion portion in the thickness direction of the display light-emitting layer are square, and the width of the cross-sectional shape of the first concave portion in the thickness direction of the display light-emitting layer is greater than the width of the cross-sectional shape of the first protrusion portion in the thickness direction of the display light-emitting layer.

Optionally, in some embodiments of the present application, an end of the first protruding portion is located in the first concave portion.

Optionally, in some embodiments of the present application, a second protrusion portion protruding toward a direction of the second section is provided on the first section.

Optionally, in some embodiments of the present application, an orthographic projection of the first protrusion portion in a direction parallel to the first section or the second section and an orthographic projection of the second protrusion portion in the direction parallel to the first section or the second section at least partially overlap.

The application provides a touch display panel, wherein the touch display panel includes: a display light-emitting layer, wherein the display light-emitting layer includes a plurality of sub-pixels arranged at intervals; a grid electrode, wherein the grid electrode is arranged on a light-emitting side of the display light-emitting layer, and the plurality of sub-pixels are located in a grid of the grid electrode; wherein, a portion of the grid of the grid electrode is provided with a fracture, the fracture includes a first section and a second section, and an angle between the first section and the second section and a grid line of the portion of the grid with the fracture of the grid electrode and an angle between the second section and the grid line of the portion of the grid with the fracture of the grid electrode are each an acute angle. In the present application, the angle between an opening direction of the fracture and the grid line of the portion of the grid with the fracture of the grid electrode is arranged to be the acute angle, so that the opening direction of the fracture is not perpendicular to the grid line of the portion of the grid with the fracture of the grid electrode, and the opening of the fracture is narrowed, thereby reducing a light leakage of a plurality of sub-pixels located in the grid, which reduces a display panel color shift, and thus reducing a problem of uneven display caused by the display panel color shift.

BRIEF DESCRIPTION OF DRAWINGS

In order to describe technical solutions in the present invention clearly, drawings to be used in the description of embodiments will be described briefly below. Obviously, drawings described below are only for some embodiments of the present invention, and other drawings can be obtained by those skilled in the art based on these drawings without creative efforts.

DETAILED DESCRIPTION OF PRESENT EMBODIMENTS

Figure 1:
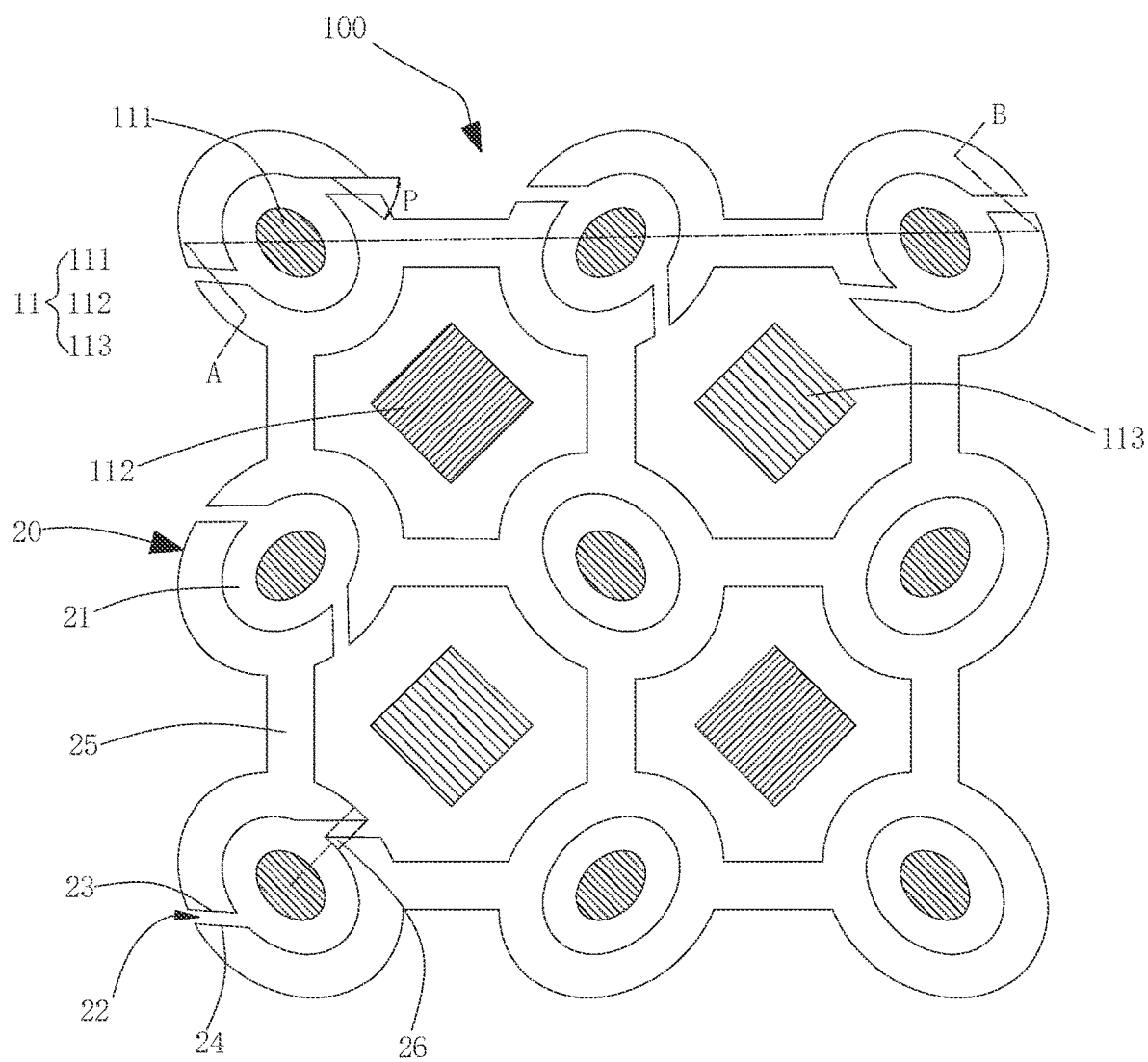
FIG. 1 is a schematic view of a touch display panel provided by a first embodiment of the present application.

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the present application.

In the description of the present application, it should be explained that the terms "center", "portrait", "transverse", "length", "width", "thickness", "upper", "lower", "front", "back", "left", "right", "vertical", "horizontal", "top", "bottom", "inside", "outside", etc. are based on the drawings. The orientation or positional relationship is only for the convenience of describing the present application and simplifying the description, and does not indicate or imply that the device or element referred to must have a specific orientation, or a structure or an operation in a specific orientation, and should not be viewed as limitations of the present application. In addition, terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "multiple" is two or more, unless specifically defined otherwise.

The word "exemplary" is used herein to mean "serving as an example, instance, or illustration." Any embodiment or design described herein as "exemplary" is not necessarily to be construed as preferred or advantageous over other embodiments or designs. The following descriptions are presented to enable any person skilled in the art to make and use the application. Descriptions of specific embodiments and applications are provided only as examples. Various modifications and combinations of the examples described herein will be readily apparent to those skilled in the art, and the general principles defined herein may be applied to other examples and applications without departing from the spirit and scope of the application. Thus, the present application is not intended to be limited to the examples described and shown, but is to be accorded the widest scope consistent with the principles and features disclosed herein. Unless otherwise specified, parallelism or perpendicularity in orientations involved in the present application are not parallelism or perpendicularity in a strict sense, as long as a corresponding structure can achieve a corresponding purpose.

The present application provides a touch display panel, which will be described in detail below. It should be noted that a description order of the following embodiments is not intended to limit a preferred order of embodiments of the present application. The touch display panel of the present application can be utilized in both liquid crystal display devices and OLED display devices.

Figure 2:
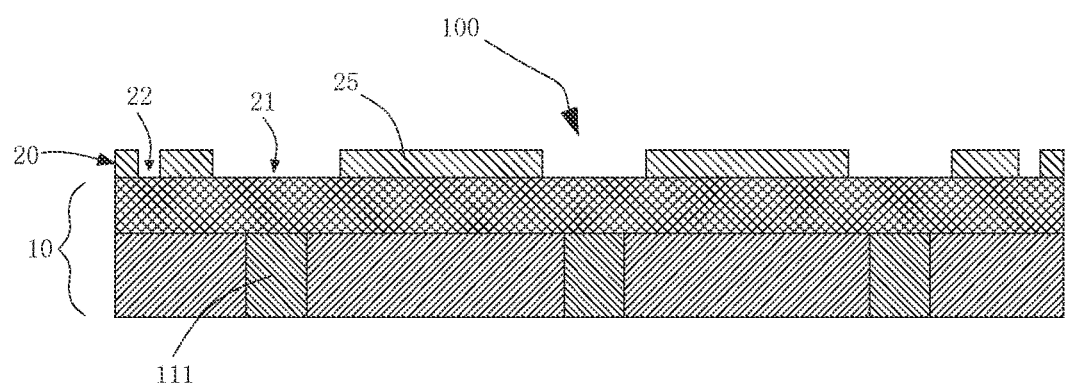
FIG. 2 is a cross-sectional view of a line A-B in FIG. 1.
Figure 3:
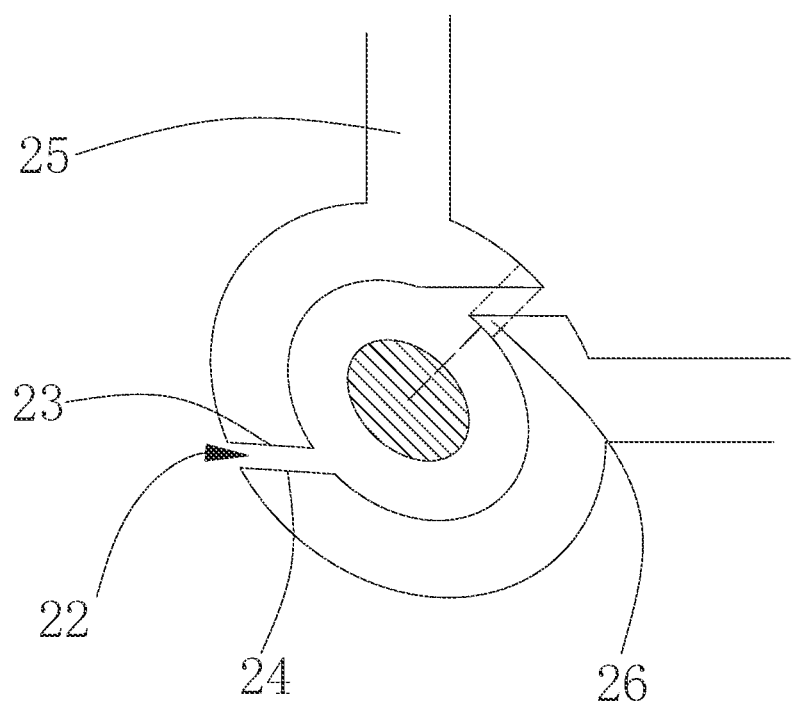
FIG. 3 is a partial enlarged view of FIG. 1.

Referring to FIGS. 1-3, FIG. 1 is a schematic view of a touch display panel 100 provided by a first embodiment of the present application, FIG. 2 is a cross-sectional view of a line A-B in FIG. 1, and FIG. 3 is a partial enlarged view of FIG. 1. An embodiment of the present application provides the touch display panel 100, which includes: an array substrate, a display light-emitting layer 10, and a grid electrode 20.

The display light-emitting layer 10 is disposed on the array substrate, and the display light-emitting layer 10 includes a plurality of sub-pixels 11 arranged at intervals. The grid electrode 20 is disposed on a light-emitting side of the display light-emitting layer 10, and the plurality of sub-pixels 11 are located in a grid 21 of the grid electrode 20.

The array substrate is a thin-film transistor array substrate commonly used in the prior art, and when arranging, the array substrate can be arranged according to the prior art, which will not be described in detail herein. In an embodiment of the present application, organic light-emitting display is used as a specific implementation manner for description. Specifically, the display light-emitting layer 10 includes an organic light-emitting layer, and the organic light-emitting layer includes the plurality of sub-pixels 11 arranged in an array, and the grid electrode 20 is disposed on a light-emitting side of the organic light-emitting layer. In order to achieve a touch function, electrodes are further arranged on the display light-emitting layer 10, i.e., the grid electrode 20 in the embodiments of the present application.

Specifically, a plurality of grids 21 of the grid electrode 20 are in one-to-one correspondences with the plurality of sub-pixels 11. That is to say, a sub-pixel 11 is provided in each of the plurality of grids 21 of the grid electrode 20. The light-emitting layer 10 includes a plurality of pixel units, the plurality of pixel units are arranged in an array to form the display light-emitting layer 10 of the display panel, and the plurality of pixel units include the plurality of light-emitting sub-pixels 11. Specifically, the plurality of light-emitting sub-pixels 11 can include a green sub-pixel 111, a red sub-pixel 112, and a blue sub-pixel 113. A region formed by each of the plurality of light-emitting sub-pixels 11 is a light-emitting region, and a region formed between two adjacent sub-pixels 11 is a non-light-emitting region. For example, a region formed between the green sub-pixel 111 and the red sub-pixel 112 is a non-light-emitting region. The grid electrode 20 is arranged in non-light-emitting regions formed between each of the plurality of light-emitting sub-pixels 11. After the grid electrode 20 is arranged, the plurality of sub-pixels 11 are located in the plurality of grids 21 of the grid electrode 20. In addition, an array arrangement of the plurality of sub-pixels 11 can be any one of a pinwheel arrangement, a tripod arrangement, a pearl arrangement, and a diamond arrangement, and can also be any other types of array arrangement.

A portion of the plurality of grids 21 of the grid electrode 20 are each provided with a fracture 22, and an angle between an opening direction of the fracture 22 and a grid line 25 of the portion of the plurality of grids 21 with the fracture 22 of the grid electrode 20 is an acute angle. Specifically, the fracture 22 includes a first section 23 and a second section 24, and the angle P between the first section 23 and the grid line 25 of the portion of the plurality of grids 21 with the fracture 22 of the grid electrode 20 and the angle P between the second section 24 and the grid line 25 of the portion of the plurality of grids 21 with the fracture 22 of the grid electrode 20 are each an acute angle.

That is to say, the present application sets the angle between the opening direction of the fracture 22 and the grid line 25 of the portion of the plurality of grids 21 with the fracture 22 of the grid electrode 20 as an acute angle, so that the opening direction of the fracture 22 is not perpendicular to the grid line 25 of a grid 21 with the fracture 22, and can therefore narrow an opening of the fracture 22, thereby reducing light leakage of the plurality of sub-pixels 111 located in the plurality of grids 21, which can reduce a display panel color shift, and thus reducing a problem of uneven display caused by the display panel color shift.

Moreover, the angle between the opening direction of the fracture 22 and the grid line 25 of the grid 21 with the fracture 22 of the grid electrode 20 is greater than or equal to 30 degrees and less than 90 degrees. Specifically, the angle P between the opening direction of the fracture 22 and the grid line 25 of the grid 21 with the fracture 22 of the grid electrode 20 is 34 degrees.

Furthermore, in some embodiments, an orthographic projection of the first section 23 in a direction perpendicular to the grid line 25 of the grid electrode 20 and an orthographic projection of the second section 24 in the direction perpendicular to the grid line 25 of the grid electrode 20 are overlapped on an overlapping portion 26, and an orthographic projection of a center point of the sub-pixel 11 in the direction perpendicular to the grid line 25 of the grid electrode 20 is located within a range of the overlapping portion 26. The orthographic projection of the center point of the sub-pixel 11 in the direction perpendicular to the grid line 25 of the grid electrode 20 is arranged within the range of the overlapping portion 26, so that most light of the plurality of sub-pixels 11 located in the plurality of grids 21 of the grid electrode 20 cannot be leaked through the fracture 22, which can further reduce the display panel color shift, and thus further reduce the problem of the uneven display caused by the display panel color shift.

Furthermore, in some embodiments, an extension plane of the first section 23 and an extension plane of the second section 24 in the opening direction of the fracture 22 are neither intersected nor tangent to the sub-pixel 11 on a plane. Since the extension plane of the first section 23 and the extension plane of the second section 24 in the opening direction of the fracture 22 are neither intersected nor tangent to the sub-pixel 11 on the plane, the opening direction of the fracture 22 can be avoided from the plurality of sub-pixels 11, so that the light of the plurality of sub-pixels 11 located in the grid 21 is not emitted from the fracture 22, which can reduce the display panel color shift, and thus solve the problem of the uneven display caused by the display panel color shift.

Figure 4:
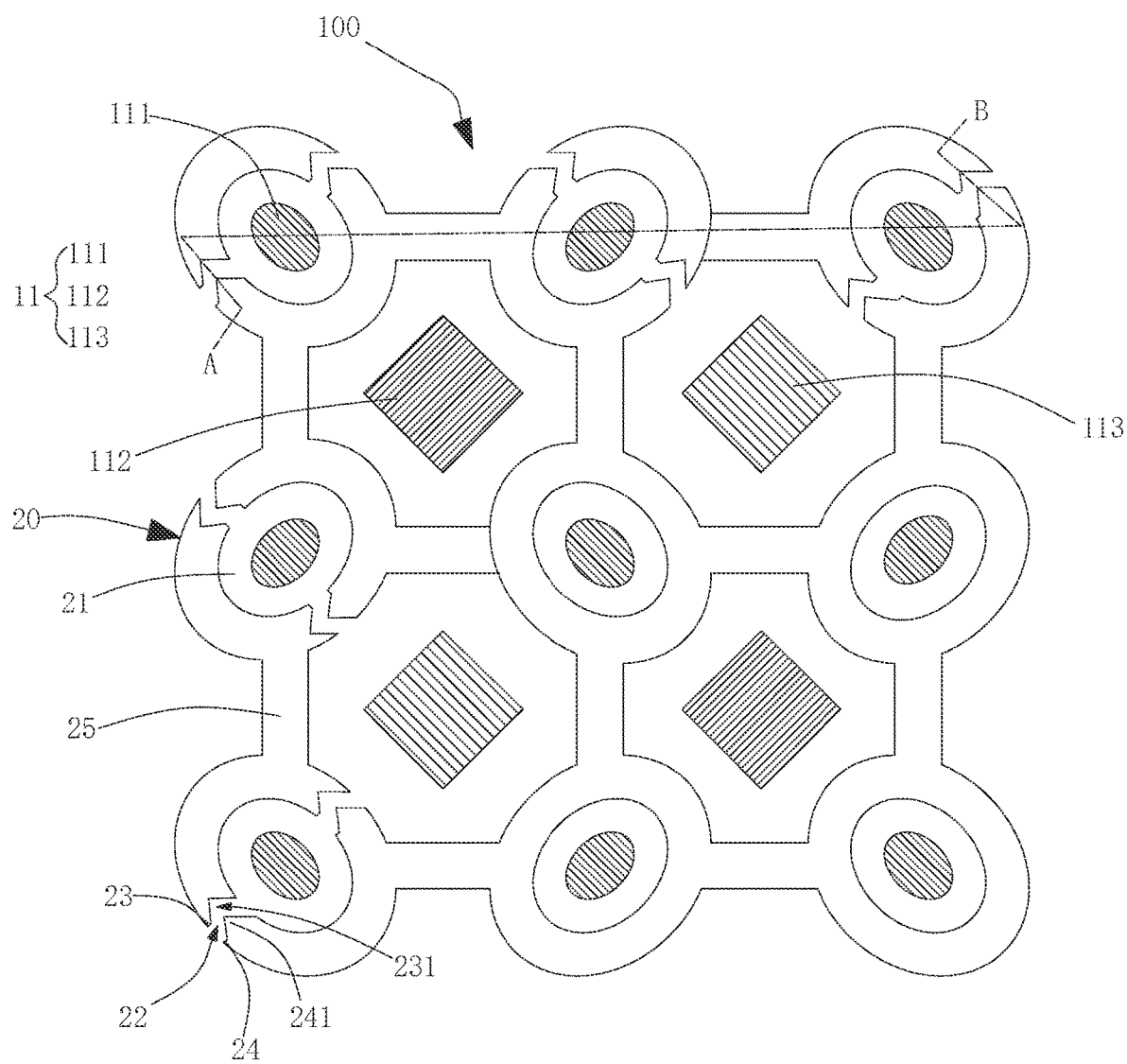
FIG. 4 is a schematic view of a touch display panel provided by a second embodiment of the present application.
Figure 5:
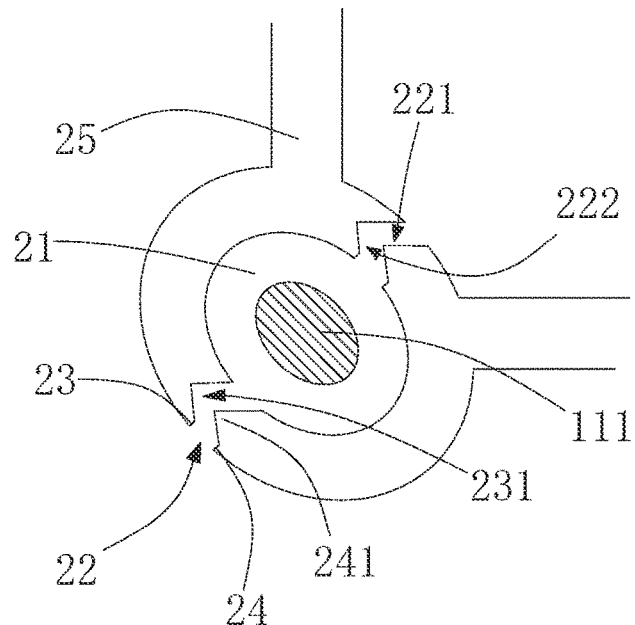
FIG. 5 is a partial enlarged view of FIG. 4.

Referring to FIGS. 4-5, FIG. 4 is a schematic view of a touch display panel 100 provided by a second embodiment of the present application, and FIG. 5 is a partial enlarged view of FIG. 4. A difference between this embodiment and the touch display panel 100 provided in FIG. 1 is that a first channel 221 and a second channel 222 are formed between the first section 23 and the second section 24, and an angle is between the first channel 221 and the second channel 222.

Furthermore, the first section 23 is provided with a first concave portion 231, and the second section 24 is provided with a first protrusion portion 241 protruding toward the first concave portion 231.

In the present application, electrodes are formed on the grid electrode 20 by providing the fracture 22 in a portion of the plurality of grids 21 of the grid electrode 20. Since adjacent electrodes is required to be insulated, the fracture 22 is required to have a certain degree of opening. In addition, the greater the opening of the fracture 22, the better an insulation between the adjacent electrodes. However, the fracture 22 causes the light of the plurality of sub-pixels 11 located in the plurality of grids 21 with the fracture 22 to leak out, which causes the display panel color shift, resulting in the uneven display of a display screen.

In the present application, the first concave portion 231 and the first protrusion portion 241 are respectively provided on the first section 23 and the second section 24 of the fracture 22, and the first channel 221 and the second channel 222 are formed on the fracture 22 between the first concave portion 231 and the first protrusion portion 241. An angle is between the first channel 221 and the second channel 222, and the angle is greater than 0 degrees and less than 180 degrees, preferably, the angle ranges from 45 degrees to 180 degrees. Therefore, the angle between the opening direction of the fracture 22 and the grid line 25 of the grid 21 with the fracture 22 of the grid electrode 20 can be an acute angle, and the opening direction of the fracture 22 is not perpendicular to the grid line 25 of the grid 21 with the fracture 22 of the grid electrode 20.

The light of the plurality of sub-pixels 11 is blocked by the first concave part 231 and the first protrusion portion 241 in directions except for a direction parallel to the first section 23 or the second section 24. Since the angle is between the first channel 221 and the second channel 222, the light of the plurality of sub-pixels 11 entering the first channel 221 from the second channel 222 and is blocked by the first concave portion 231, thereby greatly reducing the light leakage of the plurality of sub-pixels 11 of the touch display panel 100 at the fracture 22. When the orthographic projection of the first concave portion 231 and the orthographic projection of the first protrusion portion 241 in the direction parallel to the first section 23 or the second section 24 overlap, the present application can prevent the light of the plurality of sub-pixels 11 of the touch display panel 100 from leaking at the fracture 22.

In addition, the first concave portion 231 and the first protrusion portion 241 are utilized to keep an opening and an insulation of the fracture 22, so the first concave portion 231 and the first protrusion portion 241 can prevent the light of the plurality of sub-pixels 11 located in the grid 21 with the fracture 22 from leaking, so as to reduce the display panel color shift, and thus reducing the problem of the uneven display caused by the display panel color shift.

In some embodiments, a length direction of the first concave portion 231 and a length direction of the first protrusion portion 241 are parallel to a thickness direction of the display light-emitting layer 10. A length of the first concave portion 231 and a length of the first protrusion portion 241 are arranged along the thickness direction of the display light-emitting layer 10 to have a better light blocking effect, rather than being arranged perpendicular to the thickness direction the display light-emitting layer 10.

In addition, a width of a cross-sectional shape of the first concave portion 231 in the thickness direction of the display light-emitting layer 10 is arranged ascendingly in a direction from the first section 23 to the second section 24. A width of a cross-sectional shape of a protrusion portion 241 in the thickness direction of the display light-emitting layer 10 is arranged ascendingly in the direction from the first section 23 to the second section 24.

Figure 6:
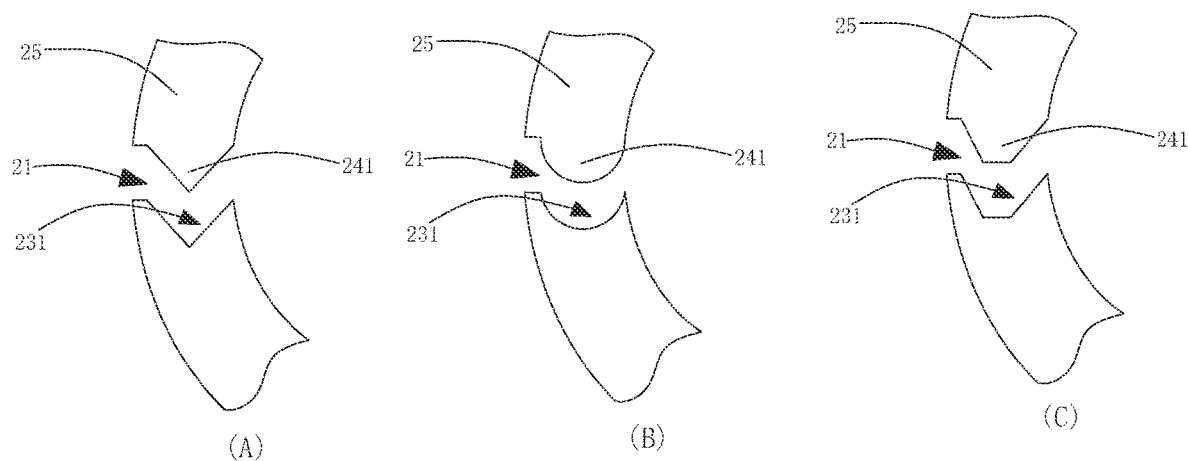
FIG. 6 is a schematic view of a first concave portion and a first protrusion portion of the touch display panel provided by the second embodiment of the present application.

Specifically, referring to FIG. 6, which is a schematic view of the first concave portion and the first protrusion portion of the touch display panel 100 provided by the second embodiment of the present application. FIG. 6 provides three types of structures of the first concave portion and the first protrusion portion (A), (B) and (C). Referring to type (A) of FIG. 6, the cross-sectional shape of the first concave portion 231 and the cross-sectional shape of the first protrusion portion 241 in the thickness direction of the display light-emitting layer 10 is a triangle. Referring to type (B) of FIG. 6, the cross-sectional shape of the first concave portion 231 and the cross-sectional shape of the first protrusion portion 241 in the thickness direction of the display light-emitting layer 10 is a semicircle. Referring to type (C) of FIG. 6, the cross-sectional shape of the first concave portion 231 and the cross-sectional shape of the first protrusion portion 241 in the thickness direction of the display light-emitting layer 10 is a trapezoid.

That is to say, through the above-mentioned arrangements, a small end of the first protrusion portion 241 protrudes toward a direction of the first concave portion 231 in the present application. Therefore, since a width of the small end of the first protrusion portion 241 is smaller and a width of a large end of the first concave portion 231 is wider, a larger distance can be between the first protrusion portion 241 and the first concave portion 231, so that the fracture 22 between adjacent electrodes has a larger opening and a greater insulation. In this way, the small end of the first protrusion portion 241 can also be arranged to be closer to the first section 23, so that the first protrusion portion 241 has a better light blocking effect.

In some embodiments, the first concave portion 231 penetrates through two sides of the first section 23 in the thickness direction of the display light-emitting layer 10. Correspondingly, the two sides of the first protrusion portion 241 in the thickness direction of the display light-emitting layer 10 are respectively flush with two sides of the first section 23 or two sides of the second section 24 in the thickness direction of the display light-emitting layer 10. Therefore, the first protrusion 241 can block the light of the plurality of sub-pixels 11 emitting from the fracture 22 with a maximum area in the thickness direction of the display light-emitting layer 10.

Figure 7:
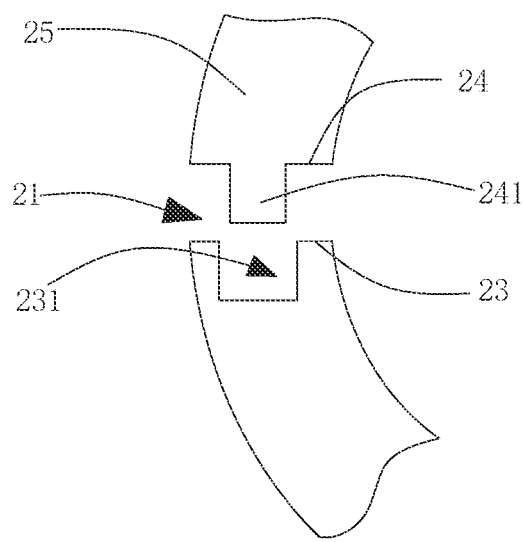
FIG. 7 is a schematic view of a touch display panel provided by a third embodiment of the present application.

Referring to FIG. 7, which is a schematic view of a touch display panel 100 provided by a third embodiment of the present application. In this embodiment, the cross-sectional shape of the first concave portion 231 and the cross-sectional shape of the first protrusion portion 241 in the thickness direction of the display light-emitting layer 10 are square, and a width of the cross-sectional shape of the first concave portion 231 is greater than a width of the cross-sectional shape of the first protrusion portion 241 in the thickness direction of the display light-emitting layer 10. That is to say, in this embodiment, the width of the cross-sectional shape of the first concave portion 231 and the width of the first protrusion portion 241 in the thickness direction of the display light-emitting layer 10 do not change in the direction from the first section 23 to the second section 24. However, when the width of the cross-sectional shape of the first concave portion 231 in the thickness direction of the display light-emitting layer 10 is larger than the width of the cross-sectional shape of the first protrusion portion 241 in the thickness direction of the display light-emitting layer 10 can also allow the fracture 22 between the adjacent electrodes to have the larger opening and the greater insulation.

Figure 8:
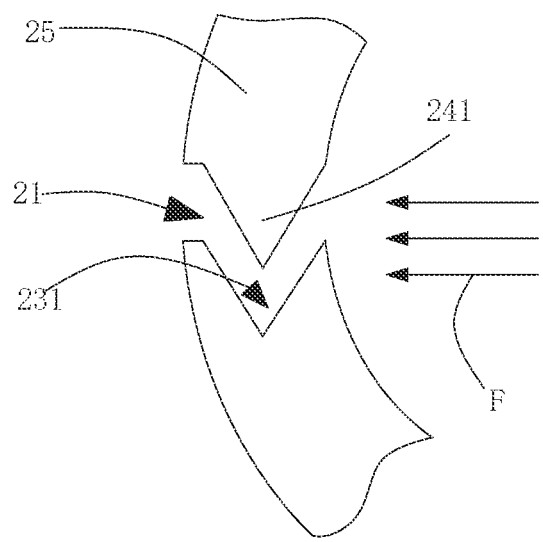
FIG. 8 is a schematic view of a touch display panel provided by a fourth embodiment of the present application.

Furthermore, referring to FIG. 8, which is a schematic view of a touch display panel 100 provided by a fourth embodiment of the present application. A difference between this embodiment and the touch display panel 100 provided in FIG. 4 is that an end of the first protrusion portion 241 is located in the first concave portion 231. An end of the first protrusion portion 241 is extended into the first concave portion 231, and the first protrusion portion 241 covers a cross-sectional surface of the fracture 22 in an exit direction F of the light of the sub-pixel 11 from the fracture 22, so that the first protrusion 241 can block the light of the plurality of sub-pixels 11 emitting from the fracture 22 with the maximum area.

Figure 9:
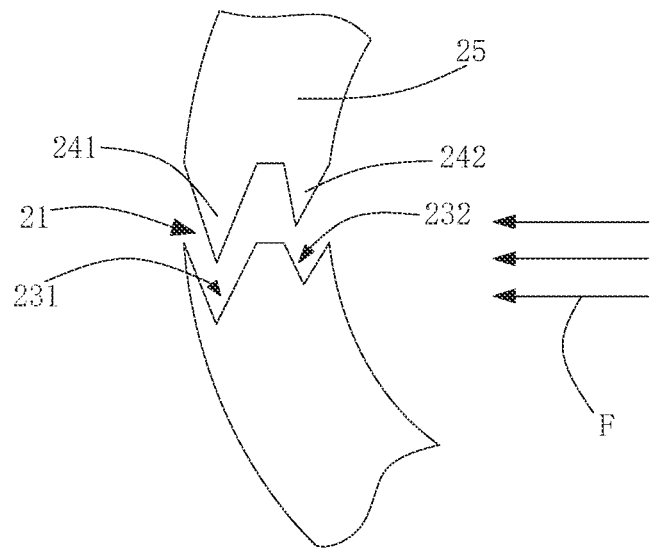
FIG. 9 is a schematic view of a touch display panel provided by a fifth embodiment of the present application.

Furthermore, referring to FIG. 9, which is a schematic view of a touch display panel 100 provided by a fifth embodiment of the present application. A difference between this embodiment and the touch display panel 100 provided in FIG. 8 is that the second section 24 is provided with a second protrusion portion 242 protruding in the direction of the first section 23. The first protrusion portion 241 and the second protrusion portion 242 are arranged at intervals along a direction F parallel to the first section 23 or the second section 24.

A length of the first protrusion portion 241 in a protruding direction is greater than a length of the second protrusion portion 242 in a protruding direction.

On a basis of an end of the first protrusion portion 241 extending into the first concave portion 231, the second section 24 is provided with a second protrusion protruding in the direction of the first section 23. The length of the first protrusion portion 241 in the protruding direction is greater than the length of the second protrusion portion 242 in the protruding direction. Although the first protrusion portion 241 can block the light of the plurality of sub-pixels 11 emitting from the fracture 22 with the maximum area, a portion of the light of the plurality of sub-pixels 11 is still emitted from a gap between the first protrusion portion 241 and the first concave portion 231. Therefore, the second protrusion portion 242 is provided for reducing the light of the plurality of sub-pixels 11 from entering the gap between the first protrusion portion 241 and the first concave portion 231, which can reduce an amount of light entering the gap between the first protrusion portion 241 and the first concave portion 231, thereby further reducing the light leakage of the plurality of sub-pixels 11.

Furthermore, the first section 23 is provided with a second concave portion 232 at a position in an extending direction of the second protrusion portion 242. Through having the second concave portion 232, a distance between the first section 23 and the second protrusion portion 242 can be increased, thereby further increasing an insulation between the first section 23 and the second protrusion portion 242.

In addition, a width of the cross-sectional shape of the second concave portion 232 in the thickness direction of the display light-emitting layer 10 is arranged ascendingly in the direction from the first section 23 to the second section 24. A width of a cross-sectional shape of the second protrusion portion 242 in the thickness direction of the display light-emitting layer 10 is arranged ascendingly in the direction from the first section 23 to the second section 24.

The cross-sectional shape of the second concave portion 232 and the cross-sectional shape of the second protrusion portion 242 in the thickness direction of the display light-emitting layer 10 are triangles.

That is to say, through the above-mentioned arrangements, a small end of the second protrusion portion 242 protrudes toward a direction of the second concave portion 232 in the present application. Therefore, since a width of the small end of the second protrusion portion 242 is smaller and a width of a large end of the second concave portion 232 is wider, a larger distance can be between the second protrusion portion 242 and the second concave portion 232, so that the fracture 22 between the adjacent electrodes has the larger opening and the greater insulation. In this way, the small end of the second protrusion portion 242 can also be arranged to be closer to the first section 23, so that the second protrusion portion 242 has a better light blocking effect.

Figure 10:
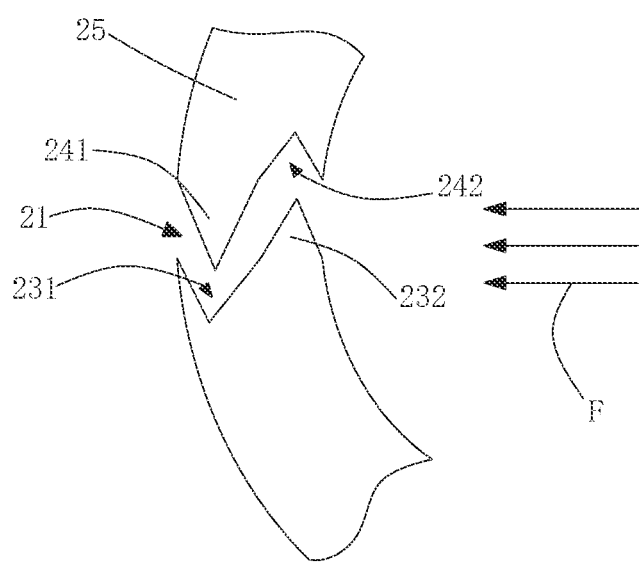
FIG. 10 is a schematic view of a touch display panel provided by a sixth embodiment of the present application.

Referring to FIG. 10, which is a schematic view of a touch display panel 100 provided by a sixth embodiment of the present application. A difference between the present embodiment and the touch display panel 100 provided in FIG. 4 is that the first section 23 is provided with a second protrusion portion 232 protruding toward the second section 24.

That is to say, in the present application, the second protrusion portion 232 is provided on the first section 23. Since the first protrusion portion 241 and the second protrusion portion 232 respectively protrude in opposite directions, the first protrusion portion 241 and the second protrusion portion together form a blocking wall at the fracture 22 to block the light of the plurality of sub-pixels 11 emitting from the fracture 22 from leaking, so as to further reduce the light leakage of the plurality of sub-pixels 11 without affecting the insulation between the first section 23 and the second section 24.

Furthermore, in some embodiments, an orthographic projection of the first protrusion portion 241 in the direction F parallel to the first section 23 or the second section 24 and an orthographic projection of the second protrusion portion 232 in the direction F parallel to the first section 23 or the second section 24 at least partially overlap.

In the present application, the orthographic projection of the first protrusion portion 241 and the orthographic projection of the second protrusion portion 232 in a direction of the light of the plurality of sub-pixels 11 emitting from the fracture 22 are overlapped, and it is not required to have the first protrusion portion 241 arranged to be adjacent to the first section 23, or have the second protrusion portion 232 arranged adjacent to the second section 24. Therefore, a larger distance can be between the first protrusion portion 241 and the first section 23, a larger distance can be between the second protrusion portion 232 and the second section 24, and a better insulation can be between the first section 23 and the second section 24.

Furthermore, the second section 24 is provided with a second concave portion 242 at a position in an extending direction of the second protrusion portion 232. In the present application, a distance between the second section 24 and the second protrusion portion 232 can be increased through arranging the second concave portion 242, thereby further increasing the insulation between the second section 24 and the second protrusion portion 232.

Moreover, the first protrusion portion 241 and the second protrusion portion 232 are arranged in parallel, which can minimize a space occupied by the first protrusion portion 241 and the second protrusion portion 232, and a larger distance can also be between the first protrusion portion 241 and the second protrusion portion 232. In addition, the length of the first protrusion portion 241 in the protruding direction is greater than a length of the second protrusion portion 232 in the protruding direction.

Specifically, having the length of the first protrusion portion 241 and the length of the second protrusion portion 232 arranged to be unequal can ensure that the orthographic projection of the first protrusion portion 241 and the orthographic projection of the second protrusion portion 232 in the direction parallel to the first section 23 or the second section 24 has an overlapping length, and, can prevent a distance between the second protrusion portion 232 and the second section 24 from being too small.

Furthermore, an end of the first protrusion portion 241 is located in the first concave portion 231, and an end of the second protrusion portion 232 is located outside the second concave portion 242. The first protrusion portion 241 and the second protrusion portion 232 can be arranged at intervals along the direction parallel to the first section 23 or the second section 24, or the second protrusion portion 232 and the second protrusion portion 241 are arranged at intervals along the direction parallel to the first section 23 or the second section 24. In this embodiment, for convenience of description, the second protrusion portion 232 and the first protrusion portion 241 are arranged at intervals along the direction parallel to the first section 23 or the second section 24, and based on this, a principle is explained that when the light of the plurality of sub-pixels 11 is emitted from the fracture 22, the emitted light first bypasses the second protrusion portion 232, then enters the gap between the first protrusion portion 241 and the first concave portion 231 along an overlapping portion of the first protrusion portion 241 and the second protrusion portion 232, and then emitted from gap between the first concave portion 241 and the first concave portion 231 bypassing the first protrusion portion 241, so that the light of the plurality of sub-pixels 11 are reflected multiple times during a process of being emitted from the fracture 22, thereby further reducing the light leakage of the plurality of sub-pixels 11 from the fracture 22.

In addition, a width of a cross-sectional shape of the second concave portion 242 in the thickness direction of the display light-emitting layer 10 is arranged descendingly in the direction from the first section 23 to the second section 24. a width of a cross-sectional shape of the second protrusion portion 232 in the thickness direction of the display light-emitting layer 10 is arranged descendingly in the direction from the first section 23 to the second section 24.

The cross-sectional shape of the second concave portion 242 and the cross-sectional shape of the second protrusion portion 232 in the thickness direction of the display light-emitting layer 10 are triangles.

That is to say, through the above-mentioned arrangements, a small end of the second protrusion portion 232 protrudes toward a direction of the second concave portion 242 in the present application. Therefore, since a width of the small end of the second protrusion portion 232 is smaller and a width of a large end of the second concave portion 242 is wider, a larger distance can be between the second protrusion portion 232 and the second concave portion 242, so that the fracture 22 between the adjacent electrodes has the larger opening and the greater insulation. In this way, the small end of the second protrusion portion 232 can also be arranged to be closer to the first section 23, so that the second protrusion portion 232 has a better light blocking effect.

Figure 11:
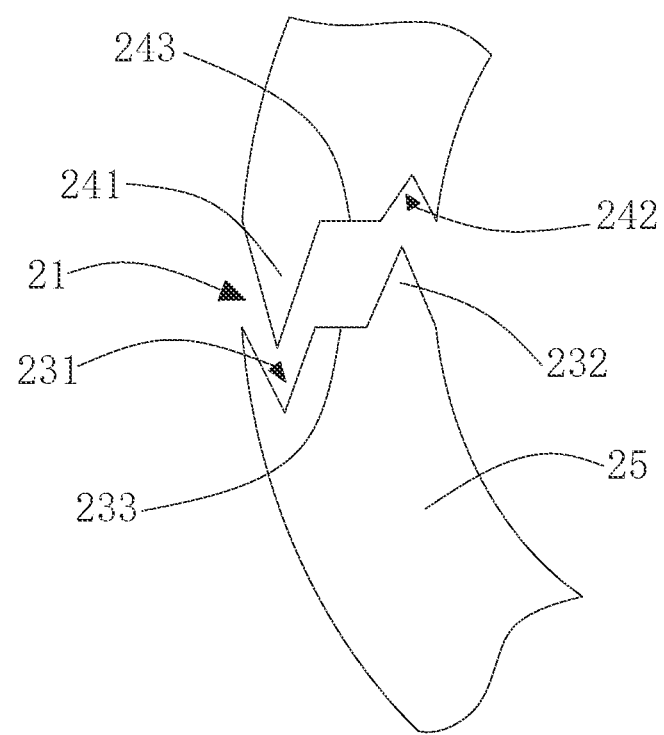
FIG. 11 is a schematic view of a touch display panel provided by a seventh embodiment of the present application.

Referring to FIG. 11, which is a schematic view of a touch display panel 100 provided by a seventh embodiment of the present application. A difference between this embodiment and the touch display panel 100 provided in FIG. 10 is that the first section 23 includes a first connecting plane 233, and the first connecting plane 233 is connected between the first concave portion 231 and the second protrusion portion 232. The second section 24 includes a second connecting plane 243 arranged corresponding to the first connecting plane 233, and the second connecting plane 243 is connected between the second concave portion 242 and the first protrusion portion 241. Through having the first connecting plane 233 and the second connecting plane 243 arranged, a distance between the second protrusion portion 232 and the first protrusion portion 241 can be increased, thereby increasing an insulation between the second protrusion portion 232 and the first protrusion portion 241.

The present application further provides a touch display device including the above-mentioned touch display panel 100.

A problem-solving principle of the touch display device is similar to a problem-solving principle of the above-mentioned touch display panel 100. Therefore, implementations and beneficial effects of the touch display device can be referred to descriptions of the above-mentioned touch display panel 100, and repeated details are not reiterated herein.

The touch display panel provided by the present application is described in detail above, the specific examples of this document are used to explain principles and embodiments of the present application, and the description of embodiments above is only for helping to understand the present application. Meanwhile, those skilled in the art will be able to change the specific embodiments and the scope of the present application according to the idea of the present application. In the above, the content of the specification should not be construed as limiting the present application. Above all, the content of the specification should not be the limitation of the present application.

What is claimed is:

1. A touch display panel comprising:
   a display light-emitting layer, wherein the display light-emitting layer comprises a plurality of sub-pixels arranged at intervals; and a grid electrode, wherein the grid electrode is arranged on a light-emitting side of the display light-emitting layer, and the plurality of sub-pixels are located in a grid of the grid electrode; wherein, a portion of the grid of the grid electrode is provided with a fracture, the fracture comprises a first section and a second section, an angle between the first section and a grid line of the portion of the grid with the fracture of the grid electrode and an angle between the second section and the grid line of the portion of the grid with the fracture of the grid electrode are each an acute angle.

2. The touch display panel according to claim 1, wherein an orthographic projection of the first section in a direction perpendicular to the grid line of the grid electrode and an orthographic projection of the second section in the direction perpendicular to the grid line of the grid electrode are overlapped on an overlapping portion, and an orthographic projection of a center point of each of the plurality of sub-pixels in the direction perpendicular to the grid line of the grid electrode is located within a range of the overlapping portion.

3. The touch display panel according to claim 1, wherein an extension plane of the first section and an extension plane of the second section in an opening direction of the fracture are neither intersected nor tangent to the plurality of sub-pixels on a plane.

4. The touch display panel according to claim 1, wherein a first channel and a second channel are formed between the first section and the second section, wherein an angle is between the first channel and the second channel.

5. The touch display panel according to claim 1, wherein a first concave portion is provided on the first section, and a first protrusion portion protruding toward the first concave portion is provided on the second section.

6. The touch display panel according to claim 5, wherein a width of a cross-sectional shape of the first concave portion in a thickness direction of the display light-emitting layer is arranged ascendingly in a direction from the first section to the second section, and a width of a cross-sectional shape of the first protrusion in the thickness direction of the display light-emitting layer is arranged ascendingly in the direction from the first section to the second section.

7. The touch display panel according to claim 5, wherein the cross-sectional shape of the first concave portion and the cross-sectional shape of the first protrusion portion in the thickness direction of the display light-emitting layer are square, and the width of the cross-sectional shape of the first concave portion in the thickness direction of the display light-emitting layer is greater than the width of the cross-sectional shape of the first protrusion portion in the thickness direction of the display light-emitting layer.

8. The touch display panel according to claim 5, wherein an end of the first protruding portion is located in the first concave portion.

9. The touch display panel according to claim 5, wherein a second protrusion portion protruding toward a direction of the second section is provided on the first section.

10. The touch display panel according to claim 9, wherein an orthographic projection of the first protrusion portion in a direction parallel to the first section or the second section and an orthographic projection of the second protrusion portion in the direction parallel to the first section or the second section at least partially overlap.

11. A touch display panel comprising:
a display light-emitting layer, wherein the display light-emitting layer comprises a plurality of sub-pixels arranged at intervals; and
a grid electrode, wherein the grid electrode is arranged on a light-emitting side of the display light-emitting layer, and the plurality of sub-pixels are located in a grid of the grid electrode; wherein,
a portion of the grid of the grid electrode is provided with a fracture, the fracture comprises a first section and a second section, an angle between the first section and a grid line of the portion of the grid with the fracture of the grid electrode and an angle between the second section and the grid line of the portion of the grid with the fracture of the grid electrode are each an acute angle; and
the angle between the first section and the grid line of the portion of the grid with the fracture of the grid electrode and the angle between the second section and the grid line of the portion of the grid with the fracture of the grid electrode is are both greater than or equal to 30 degrees and less than 90 degrees.

12. The touch display panel according to claim 11, wherein an orthographic projection of the first section in a direction perpendicular to the grid line of the grid electrode and an orthographic projection of the second section in the direction perpendicular to the grid line of the grid electrode are overlapped on an overlapping portion, and an orthographic projection of a center point of each of the plurality of sub-pixels in the direction perpendicular to the grid line of the grid electrode is located within a range of the overlapping portion.

13. The touch display panel according to claim 11, wherein an extension plane of the first section and an extension plane of the second section in an opening direction of the fracture are neither intersected nor tangent to the plurality of sub-pixels on a plane.

14. The touch display panel according to claim 11, wherein a first channel and a second channel are formed between the first section and the second section, wherein an angle is between the first channel and the second channel.

15. The touch display panel according to claim 11, wherein a first concave portion is provided on the first section, and a first protrusion portion protruding toward the first concave portion is provided on the second section.

16. The touch display panel according to claim 15, wherein a width of a cross-sectional shape of the first concave portion in a thickness direction of the display light-emitting layer is arranged ascendingly in a direction from the first section to the second section, and a width of a cross-sectional shape of the first protrusion in the thickness direction of the display light-emitting layer is arranged ascendingly in the direction from the first section to the second section.

17. The touch display panel according to claim 15, wherein the cross-sectional shape of the first concave portion and the cross-sectional shape of the first protrusion portion in the thickness direction of the display light-emitting layer are square, and the width of the cross-sectional shape of the first concave portion in the thickness direction of the display light-emitting layer is greater than the width of the cross-sectional shape of the first protrusion portion in the thickness direction of the display light-emitting layer.

18. The touch display panel according to claim 15, wherein an end of the first protruding portion is located in the first concave portion.

19. The touch display panel according to claim 15, wherein a second protrusion portion protruding toward a direction of the second section is provided on the first section.

20. The touch display panel according to claim 19, wherein an orthographic projection of the first protrusion portion in a direction parallel to the first section or the second section and an orthographic projection of the second protrusion portion in the direction parallel to the first section or the second section at least partially overlap.

\* \* \* \* \*